(12) United States Patent
Hung

(10) Patent No.: US 11,347,210 B2
(45) Date of Patent: May 31, 2022

(54) METHOD AND SYSTEM FOR DEVELOPING SEMICONDUCTOR DEVICE FABRICATION PROCESSES

(71) Applicant: AICP Technology Corporation, Miaoli County (TW)

(72) Inventor: Kei-Kang Hung, Hsinchu County (TW)

(73) Assignee: AICP TECHNOLOGY CORPORATION, Miaoli County (TW)

(*) Notice: Subject to any disclaimer, the term of this patent is extended or adjusted under 35 U.S.C. 154(b) by 71 days.

(21) Appl. No.: 16/701,224

(22) Filed: Dec. 3, 2019

(65) Prior Publication Data

US 2020/0241512 A1 Jul. 30, 2020

(30) Foreign Application Priority Data

Jan. 30, 2019 (TW) ................................ 108103559

(51) Int. Cl.
*H01L 29/66* (2006.01)
*G05B 19/418* (2006.01)

(52) U.S. Cl.
CPC .............. *G05B 19/41865* (2013.01); *G05B 2219/45031* (2013.01); *H01L 29/6625* (2013.01);
(Continued)

(58) Field of Classification Search
CPC .... G05B 19/41865; G05B 2219/45031; G05B 19/41885; H01L 29/66666;
(Continued)

(56) References Cited

U.S. PATENT DOCUMENTS

2003/0216827 A1* 11/2003 Mouli ................ G06F 30/327
700/97
2004/0019872 A1* 1/2004 Lippincott .......... G06F 30/39
716/53

(Continued)

FOREIGN PATENT DOCUMENTS

| CN | 100552582 C | 10/2009 |
| CN | 102156794 A | 8/2011 |
| TW | 201617283 A | 5/2016 |

*Primary Examiner* — Sheikh Maruf
(74) *Attorney, Agent, or Firm* — Li & Cai Intellectual Property (USA) Office

(57) ABSTRACT

A method and a system for developing semiconductor device fabrication processes are provided. The developments of vertical and lateral semiconductor device fabrication processes can be integrated in the system. First, according to a target semiconductor device and a specification thereof, an initial target model and a general database are captured. The initial target model and the general database are compared to obtain a corresponding relationship. According to the corresponding relationship, multiple fixed fabrication parameters of the general database are applied to the initial target model, such that at least one adjustable parameter is defined. Thereafter, the parameter is set according to a setting instruction received through a user interface to produce a target model to be simulated. A simulation test is performed with the target model, and the adjustable parameter is modified until the simulation result of the target model satisfies a standard result.

10 Claims, 4 Drawing Sheets

(52) U.S. Cl.
CPC .. *H01L 29/66272* (2013.01); *H01L 29/66477* (2013.01); *H01L 29/66666* (2013.01)

(58) Field of Classification Search
CPC ........... H01L 29/66477; H01L 29/6625; H01L 29/66272; H01L 29/00
USPC .......................................................... 700/97
See application file for complete search history.

(56) References Cited

U.S. PATENT DOCUMENTS

| | | | | |
|---|---|---|---|---|
| 2005/0071035 | A1* | 3/2005 | Strang | G05B 19/41885 700/121 |
| 2007/0050749 | A1* | 3/2007 | Ye | G03F 7/70641 430/30 |
| 2009/0005894 | A1* | 1/2009 | Bomholt | G06F 30/20 700/97 |
| 2011/0022215 | A1* | 1/2011 | Keil | C23C 16/52 700/110 |
| 2013/0066454 | A1* | 3/2013 | Geshel | G06F 30/00 700/97 |
| 2013/0080125 | A1* | 3/2013 | Baseman | G05B 17/02 703/2 |
| 2013/0310960 | A1* | 11/2013 | Chang | G05B 19/41865 700/97 |
| 2013/0325156 | A1* | 12/2013 | Grant | G05B 19/4097 700/97 |
| 2014/0124774 | A1* | 5/2014 | Liu | H01L 29/66409 257/43 |
| 2014/0152383 | A1* | 6/2014 | Nikonov | H01L 27/281 327/564 |
| 2014/0222182 | A1* | 8/2014 | Currie | G05B 19/41865 700/97 |
| 2014/0367772 | A1* | 12/2014 | Mauder | H01L 29/402 257/330 |
| 2015/0045923 | A1* | 2/2015 | Chang | G05B 19/41865 700/97 |
| 2015/0066177 | A1* | 3/2015 | Chien | H01L 22/20 700/97 |
| 2015/0105887 | A1* | 4/2015 | Troy | G05B 19/41865 700/97 |
| 2015/0105888 | A1* | 4/2015 | Grove | G06F 16/219 700/97 |
| 2015/0112468 | A1* | 4/2015 | Rudnick, III | G05B 19/4097 700/98 |
| 2015/0153723 | A1* | 6/2015 | Raviola | G06Q 10/0631 700/97 |
| 2015/0158176 | A1* | 6/2015 | Fujita | H05K 13/0812 700/121 |
| 2015/0293530 | A1* | 10/2015 | Haskell | G06Q 10/0631 700/97 |
| 2015/0355620 | A1* | 12/2015 | Hsiao | G05B 19/41865 700/97 |
| 2015/0371134 | A1* | 12/2015 | Chien | G06N 3/02 706/21 |
| 2016/0070250 | A1* | 3/2016 | Takahashi | G05B 19/0426 700/97 |
| 2016/0377674 | A1* | 12/2016 | Bickford | G01R 31/2894 700/97 |
| 2017/0363950 | A1* | 12/2017 | Sriraman | G06F 30/398 |
| 2019/0311083 | A1* | 10/2019 | Feng | G03F 1/36 |
| 2020/0218844 | A1* | 7/2020 | Feng | G03F 7/70625 |
| 2020/0410413 | A1* | 12/2020 | Moki | G05B 19/41885 |

* cited by examiner

METHOD AND SYSTEM FOR DEVELOPING SEMICONDUCTOR DEVICE FABRICATION PROCESSES

CROSS-REFERENCE TO RELATED PATENT APPLICATION

This application claims the benefit of priority to Taiwan Patent Application No. 108103559, filed on Jan. 30, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a method and a system for developing semiconductor device fabrication processes, and more particularly to a method and a system that integrate fabrication process developments of lateral and vertical semiconductor devices.

BACKGROUND OF THE DISCLOSURE

In recent years, a semiconductor device, such as a diode or a transistor, is widely applied in an integrated circuit as one of crucial devices therein. The semiconductor device is structurally classified into a lateral semiconductor device and a vertical semiconductor device.

A power MOSFET is taken as an example for description herein. A lateral MOSFET has relatively low manufacturing cost but a large size, and is unsuitable for being operated at high power and large current. A vertical MOSFET having a small chip size can bear a relatively high voltage, and can be operated at high power and large current. However, the vertical MOSFET has relatively high manufacturing cost.

Therefore, the lateral and vertical semiconductor devices each have its own advantages and fields of application. However, there are currently different fabrication process development systems, and each is only applicable to fabrication process development of a semiconductor device of a corresponding type. For example, a fabrication process development system for the lateral MOSFET is only applicable to development of a fabrication process of the lateral MOSFET, but is inapplicable to development of a fabrication process of the vertical MOSFET; and vice versa.

Furthermore, whenever a development of a new semiconductor device fabrication process is required, all parameters need to be reset for simulation. Excessive variable parameters would prolong the development of the semiconductor device.

SUMMARY OF THE DISCLOSURE

A technical problem to be solved by the present disclosure is to provide a method and a system for developing semiconductor device fabrication processes, which are applicable to developments of different types of semiconductor devices.

To solve the foregoing technical problem, one technical solution used by the present disclosure is to provide a method for developing semiconductor device fabrication processes. The method for developing semiconductor device fabrication processes includes the following steps: obtaining an initial target model according to a target semiconductor device, where the initial target model includes multiple preset fabrication steps each corresponding to multiple preset parameter values; capturing a general database according to specifications of the target semiconductor device, where the general database includes multiple general fabrication steps each corresponding to multiple fixed fabrication parameter values; comparing the initial target model with the general database, to obtain a corresponding relationship; applying the multiple fixed fabrication parameter values to the initial target model according to the corresponding relationship, and defining at least one adjustable parameter; setting the at least one adjustable parameter according to a setting instruction received through a user interface, to produce a target model to be simulated; and performing a simulation test with the target model to be simulated to obtain a simulation result.

To solve the foregoing technical problem, the other technical solution used by the present disclosure is to provide a system for developing semiconductor device fabrication processes. The system includes a user operation module and a memory unit electrically connected to the user operation module. The user operation module is configured to simulate fabrication of a lateral semiconductor device or a vertical semiconductor device. The memory unit stores an initial target model database and multiple general databases. The initial target model database includes a first initial target model for simulating fabrication of the lateral semiconductor device and a second initial target model for simulating fabrication of the vertical semiconductor device; and each of the general databases includes multiple fixed fabrication parameter values. The user operation module selects the first initial target model from the initial target model database according to a received selection instruction, and captures one of the general databases according to specifications of the selected first initial target model. The user operation module applies the multiple fixed fabrication parameter values to the first initial target model according to a corresponding relationship between the first initial target model and the general database, defines at least one adjustable parameter, and sets the adjustable parameter according to a received setting instruction, to produce a target model to be simulated.

Therefore, the present disclosure has the following beneficial effects. In the method and system for developing semiconductor device fabrication processes provided by the present disclosure, multiple fixed fabrication parameter values in a general database are applied to an initial target model corresponding to a lateral semiconductor device or a vertical semiconductor device, thus reducing the number of parameters to be set. When the number of the parameters to be set is reduced, the number of variables to be manually input is reduced, thus further shortening the development time.

To further understand the features and technical content of the present disclosure, reference is made to the following detailed description and accompanying drawings of the present disclosure. However, the accompanying drawings are merely used to provide reference and description, and are not intended to limit the present disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
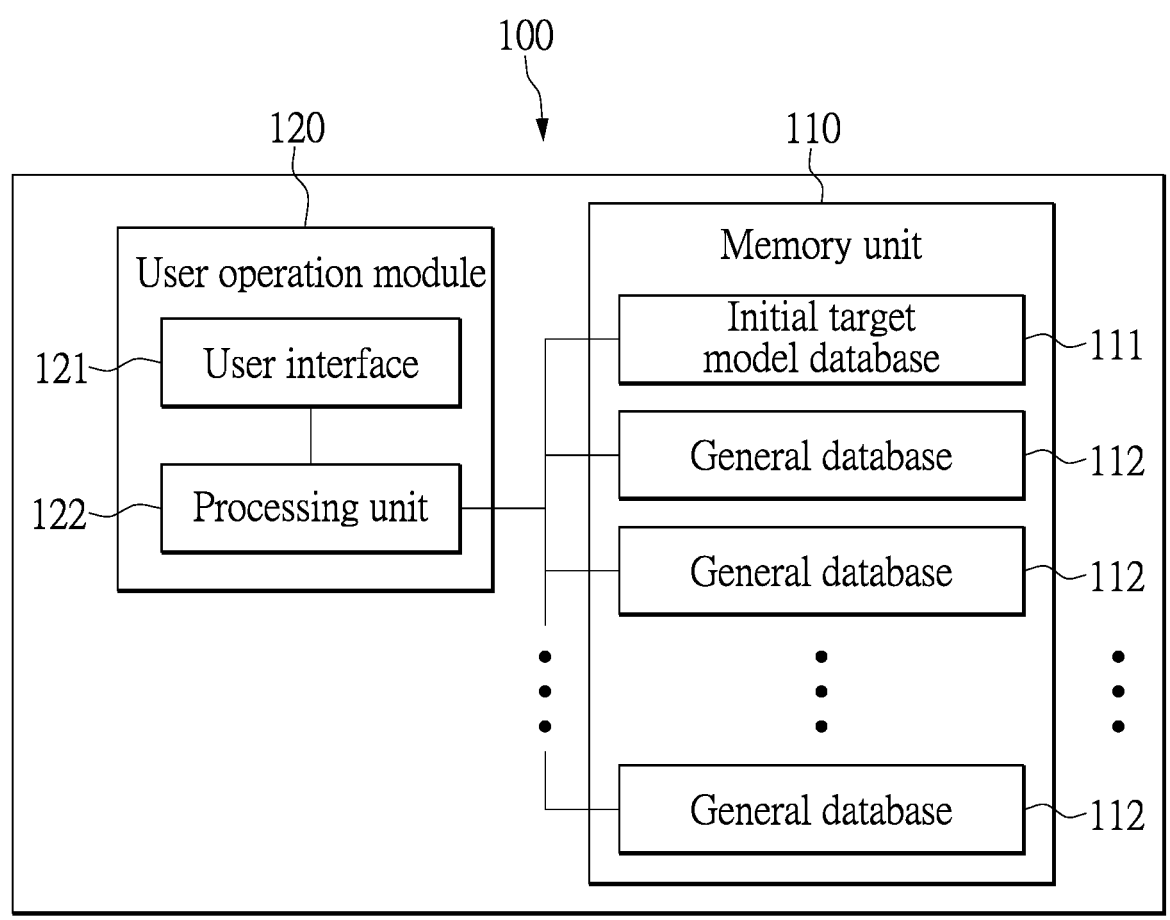
FIG. 1 is a functional block diagram of a system for developing semiconductor device fabrication processes in accordance with an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The following describes an implementation manner of a "method and system for developing semiconductor device fabrication processes" disclosed by the present disclosure through specific embodiments.

Referring to FIG. 1, FIG. 1 is a functional block diagram of a system for developing semiconductor device fabrication processes in accordance with an embodiment of the present disclosure. The system 100 for developing semiconductor device fabrication processes in the embodiment of the present disclosure is used to perform a method for developing the semiconductor device fabrication processes, and is applicable to development fabrication processes of different types of semiconductor devices.

Furthermore, a user can use the system 100 for developing semiconductor device fabrication processes to preset multiple fabrication parameter values for fabrication of a target semiconductor device, and then to simulate the electrical property or other properties of the target semiconductor device fabricated according to these fabrication parameter values. When a simulation result does not satisfy a standard, the fabrication parameter values are required to be modified, and new parameters are required to be input.

The target semiconductor device may be a lateral semiconductor device or a vertical semiconductor device. For example, the target semiconductor device is a bipolar transistor, a MOSFET, a trench-type power transistor, a diode, or the like.

In the embodiment of the present disclosure, portions of the target semiconductor device are defined as substructures. For example, a base region, an emitter region, and a collector region of the lateral bipolar transistor may be defined as different substructures. Likewise, a base region, an emitter region, a collector region, and an isolation channel in the base region in the vertical bipolar transistor may also be defined as different substructures. For another example, a base region, a source region, a drain region, a gate insulating layer, and a gate electrode of a vertical MOSFET may also be defined as different substructures.

It should be noted that, although different semiconductor devices have different substructures, some substructures of one of two specific semiconductor devices may correspond to some substructures of the other semiconductor device.

Accordingly, during simulation of different semiconductor devices by using the system 100 for developing semiconductor device fabrication processes in the embodiment of the present disclosure, corresponding substructures in the several different semiconductor devices share identical parameter values. Therefore, the system 100 for developing semiconductor device fabrication processes in the embodiment of the present disclosure is applicable to development of multiple types of semiconductor devices having different structures or different operating principles.

Further referring to FIG. 1, the system 100 for developing semiconductor device fabrication processes includes a memory unit 110 and a user operation module 120.

The memory unit 110 stores an initial target model database 111 and multiple general databases 112. The initial target model database 111 includes multiple initial target models for simulating fabrication of different semiconductor devices. At least one of the multiple initial target models corresponds to a lateral semiconductor device, and another one of the multiple initial target models corresponds to a vertical semiconductor device.

Each initial target model includes multiple preset fabrication process templates each corresponding to multiple preset parameter items. Furthermore, each preset fabrication process template corresponds to several steps and conditions of simulating fabrication of one substructure of a semiconductor device. Therefore, in the preset fabrication process template, the multiple parameter items refer to multiple fabrication parameter values to be further set in several steps of fabricating one of the substructures.

Figure 2:
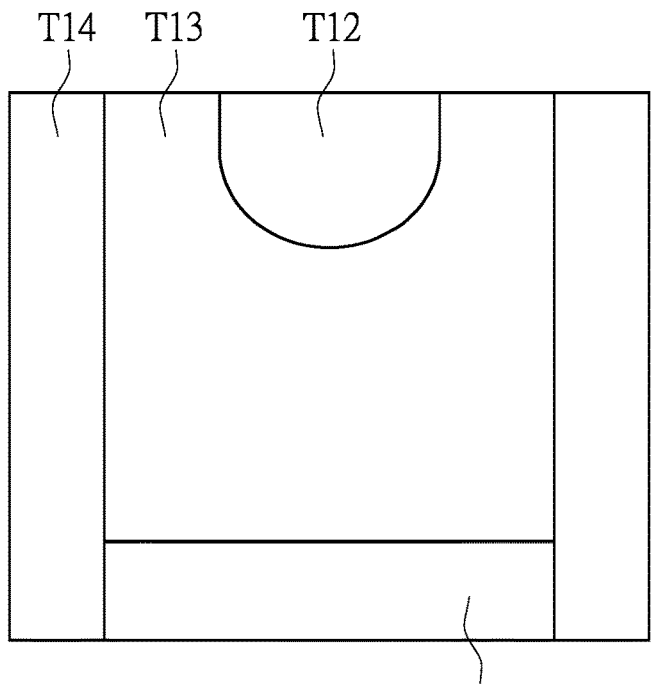
FIG. 2 is a schematic partial cross-sectional diagram of a vertical bipolar transistor.
Figure 3:
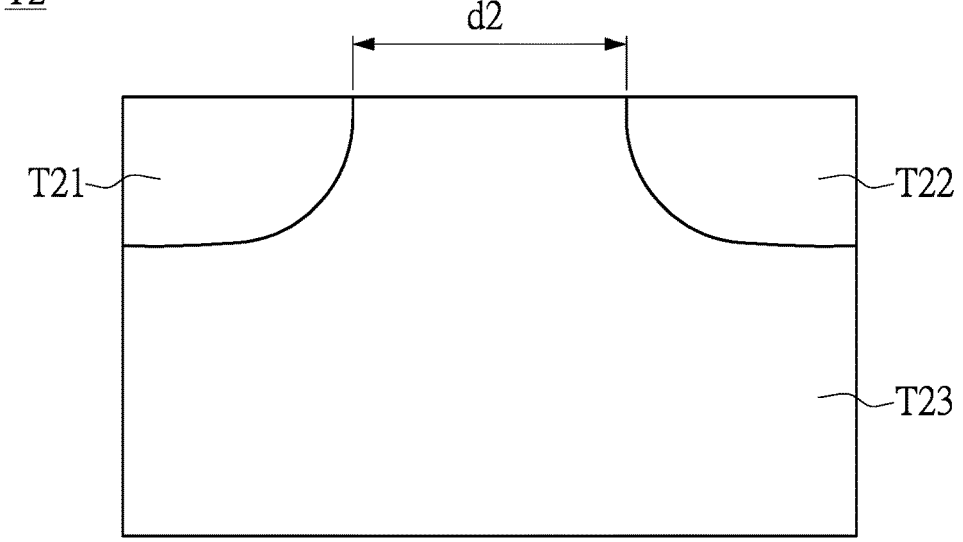
FIG. 3 is a schematic partial cross-sectional diagram of a lateral bipolar transistor.

Referring to FIGS. 2 and 3, FIG. 2 is a schematic partial cross-sectional diagram of a vertical bipolar transistor, and FIG. 3 is a schematic partial cross-sectional diagram of a lateral bipolar transistor.

As shown in FIG. 2, multiple substructures of a vertical bipolar transistor T1 at least include a substrate T11, a base region T13, an emitter region T12, and an isolation portion T14. The substrate T11 is a heavily-doped semiconductor substrate which can serve as a collector region of the vertical bipolar transistor T1. The base region T13 is provided above the substrate T11. The emitter region T12 is located away from the substrate T11 in the base region T13. In addition, the isolation portion T14 is formed in the base region T13.

As shown in FIG. 3, multiple substructures of a lateral bipolar transistor T2 at least include a base region T23, an emitter region T22, and a collector region T21. The emitter region T22 and the collector region T21 are both provided in the base region T23, and are spaced apart by a distance d1.

Referring to the following table 1, using a fabrication process of the lateral bipolar transistor T2 in the simulation diagram 3 as an example, it can be observed that at least one preset fabrication process template P1 corresponds to several steps and conditions of simulating fabrication of the base region. Therefore, in the preset fabrication process template P1, parameter items P11 to P15 are respectively an impurity material, doping density, ion implantation energy, annealing temperature, and dimensions (including length, width, and height) of the base region.

In addition, at least one preset fabrication process template P2 corresponds to several steps and conditions of simulating fabrication of the emitter region and the collector region. Therefore, in the preset fabrication process template P2, parameter items P21 to P27 are respectively an impurity material, doping density, ion implantation energy, annealing temperature, a range of the emitter region, a range of the collector region, and a distance between the emitter region and the collector region.

TABLE 1

| Preset fabrication process templates | Parameter items |
|---|---|
| P1: Forming the base region | P11: impurity material |
| | P12: doping density |
| | P13: ion implantation energy |
| | P14: annealing temperature |
| | P15: dimensions (including length, width, and height) of the base region |
| P2: Forming the mutually spaced emitter region and collector region | P21: impurity material |
| | P22: doping density |
| | P23: ion implantation energy |
| | P24: annealing temperature |
| | P25: range (including area and depth) of the emitter region |
| | P26: range (including area and depth) of the collector region |
| | P27: distance between the emitter region and the collector region |

It should be noted that, the number of the preset fabrication process templates P1 and P2 and the number of the parameter items P11 to P15 and P21 to P27 may be adjusted according to actual demands. The preset fabrication process templates P1 and P2 and the parameter items P11 to P15 and P21 to P27 in table 1 are merely used as examples for description, and the present disclosure is not limited thereto.

As described above, in the system 100 for developing semiconductor device fabrication processes in the embodiment of the present disclosure, corresponding substructures of several different semiconductor devices share identical parameter values. Accordingly, the memory unit 110 further stores multiple general databases 112. Each general database 112 includes multiple general fabrication process templates each corresponding to multiple general parameter items. Each general parameter item corresponds to at least one fixed fabrication parameter. A method for establishing the multiple general databases 112 will be introduced later, and is not described herein.

It should be noted that, for two specific semiconductor devices, several corresponding equivalent substructures may be defined according to corresponding substructures between the two semiconductor devices.

Referring to FIG. 2 and FIG. 3, for example, the lateral bipolar transistor T2 and the vertical bipolar transistor T1 are respectively a lateral NPN bipolar transistor and a vertical NPN bipolar transistor, and the base region T23 of the lateral bipolar transistor T2 and the base region T13 of the vertical bipolar transistor T1 have the same conductivity type. For example, they are both P-type lightly doped regions. Therefore, the base region T23 of the lateral bipolar transistor T2 corresponds to the base region T13 of the vertical bipolar transistor T1. Accordingly, the base region T23 of the lateral bipolar transistor T2 and the base region T13 of the vertical bipolar transistor T1 are defined as an equivalent substructure.

In addition, the emitter region T22 of the lateral bipolar transistor T2 and the emitter region T12 of the vertical bipolar transistor T1 have the same conductivity type. For example, they are both N-type heavily doped regions. Therefore, the emitter region T22 of the lateral bipolar transistor T2 corresponds to the emitter region T12 of the vertical bipolar transistor T1, and accordingly, another equivalent substructure can be defined. Likewise, the collector region T21 of the lateral bipolar transistor T2 corresponds to the substrate T11 of the vertical bipolar transistor T1, and accordingly, another equivalent substructure can be defined.

That is to say, although positions of the multiple substructures of the lateral NPN bipolar transistor are different from positions of the multiple substructures of the vertical NPN bipolar transistor, the multiple substructures of the lateral NPN bipolar transistor may still correspond to at least some of the substructures of the vertical NPN bipolar transistor.

Based on the foregoing description, at least three equivalent substructures can be defined between the lateral NPN bipolar transistor and the vertical NPN bipolar transistor, namely, the emitter region, the base region, and the collector region (or the substrate).

If the lateral NPN bipolar transistor and a lateral N-type MOSFET are used as examples, the base region T23, the emitter region T22, and the collector region T21 of the lateral NPN bipolar transistor may respectively correspond to a base region, a source region, and a drain region of the lateral N-type MOSFET (not shown in the figure).

Thus, each general fabrication process template corresponds to several steps and conditions of simulating fabrication of a corresponding equivalent substructure. In the general fabrication process template, the multiple general parameter items refer to items shared in the steps of fabricating the corresponding equivalent substructure.

That is to say, each general database 112 may correspond to several different types of semiconductor devices. During simulation of fabrication of the different semiconductor devices, multiple general fabrication process templates in one general database 112 may be applied to initial target models corresponding to the different semiconductor devices. Furthermore, in the general database 112, multiple fixed fabrication parameter values corresponding to the multiple general parameter items in each general fabrication process template may be applied to different initial target models.

For example, multiple general fabrication process templates in one of the general databases 112 may be used for fabrication of several corresponding equivalent substructures defined between the lateral NPN bipolar transistor and the vertical NPN bipolar transistor.

Referring to the following table 2, the general fabrication process templates G1 and G2 correspond to several general fabrication steps and conditions of fabricating several equivalent substructures respectively.

TABLE 2

| General fabrication process templates | General parameter items | Fixed fabrication parameter values |
|---|---|---|
| G1: Forming the base region | G11: impurity material | Boron (B) |
| | G12: doping density | 3E13 |
| | G13: ion implantation energy | 100 KeV |
| | G14: annealing temperature | 1000° C. to 1150° C. |
| | G15: dimensions (including length, width, and height) of the base region | 400 μm × 200 μm × (3~7)μm |
| G2: Forming the emitter region and/or the collector region | G21: impurity material | Arsenic (As) |
| | G22: doping density | 3.5E15 |
| | G23: ion implantation energy | 60 KeV |
| | G24: annealing temperature | 800° C. to 1000° C. |

As shown in table 2, in the general fabrication process template G1, the general parameter items G11 to G15 are respectively an impurity material, doping density, ion implantation energy, annealing temperature, and dimensions (including length, width, and height) of the base region. In addition, each of the general parameter items G11 to G15 already has a corresponding preset fixed parameter value.

Moreover, the at least one general fabrication process template G2 corresponds to several general fabrication steps and conditions of simulating fabrication of the emitter region and the collector region of both the lateral NPN bipolar transistor and the vertical NPN bipolar transistor. Accordingly, in a general fabrication process template G2, the general parameter items G21 to G24 are respectively an impurity material, doping density, ion implantation energy, and annealing temperature. In addition, each of the general parameter items G21 to G24 already has a corresponding preset fixed fabrication parameter value.

In the general fabrication process templates G1 and G2, the multiple fixed fabrication parameter values may be input according to fabrication experience of the lateral NPN bipolar transistor or the vertical NPN bipolar transistor. For example, the multiple fixed fabrication parameter values in the general fabrication process template G1 are fabrication parameter values used for fabrication of the base region of the vertical NPN bipolar transistor, and the multiple fixed fabrication parameter values in the general fabrication process template G2 are fabrication parameter values used for fabrication of the emitter region of the vertical NPN bipolar transistor.

It should be noted that, the number of the general fabrication process templates G1 and G2 and the number of the general parameter items G11 to G15 and G21 to G24 in table 2 may be changed or adjusted according to the type of an applicable semiconductor device. The general fabrication process templates G1 and G2 and the general parameter items G11 to G15 and G21 to G24 in table 2 are merely used as examples for description, and the present disclosure is not limited thereto.

Therefore, the multiple fixed fabrication parameter values corresponding to the multiple general fabrication process templates can be applied to both an initial target model corresponding to the lateral NPN bipolar transistor and an initial target model corresponding to the vertical NPN bipolar transistor.

In addition, during fabrication of a semiconductor device of two different specifications, for example, during fabrication of the lateral NPN bipolar transistor, the required fabrication parameter values are different. Therefore, in an embodiment, the general databases 112 also need to be differentiated according to the specifications of the semiconductor devices.

That is to say, each of the general databases 112 may be established according to the specifications of a semiconductor device. Accordingly, the multiple general databases 112 respectively correspond to semiconductor device groups of different specifications, and multiple semiconductor devices in one semiconductor device group have identical specifications. The specifications may include an operating voltage and a chip size of the semiconductor device.

For example, one of the general databases 112 may correspond to a first semiconductor device group with an operating voltage of 3.3V and a chip size of about 0.25 μm. The multiple semiconductor devices in the first semiconductor device group may include, but are not limited to, a lateral bipolar transistor, a vertical bipolar transistor, a lateral MOSFET, a vertical MOSFET, and a diode. Likewise, another general database 112 may correspond to a second semiconductor device group with an operating voltage of 5V and a chip size of about 0.25 μm.

Thus, for an initial target model corresponding to a target semiconductor device, multiple fixed fabrication parameter values in a corresponding general database 112 may be applied to the initial target model according to the specifications of the target semiconductor device.

As shown in FIG. 1, the user operation module 120 is configured to simulate fabrication of a semiconductor device, where the semiconductor device may be a lateral semiconductor device or a vertical semiconductor device. The user operation module 120 includes a user interface 121 and a processing unit 122 electrically connected to the user interface 121.

The user interface 121 is used by a user to input multiple instructions. The processing unit 122 receives the instructions input by the user through the user interface 121, and according to the instructions, performs operations corresponding to the instructions.

The processing unit 122 may include one or multiple processors, controllers, micro-processors, micro-controllers, dedicated integrated circuits, digital signal processors, programmable logic devices, field programmable gate arrays, and memories, or any combination thereof.

In an embodiment, the processing unit 122 internally stores fabrication process simulation software. By executing the fabrication process simulation software and using the databases stored in the memory unit 110, simulation of fabrication processes of multiple different semiconductor devices can be completed.

The processing unit 122 selects an initial target model corresponding to a target semiconductor device from the initial target model database 111 according to a selection instruction received through the user interface. As described above, the initial target model includes multiple preset fabrication process templates each including multiple preset parameter items.

Moreover, the processing unit 122 obtains multiple fixed fabrication parameter values from a corresponding general database 112 according to specifications of the selected initial target model. Specifically, the processing unit 122 can apply several corresponding fixed fabrication parameter values to some parameter items in the initial target model according to a template corresponding relationship between the multiple general fabrication process templates in the general database 112 and the multiple preset fabrication process templates, such that at least one adjustable parameter is defined.

The user then can input a setting instruction through the user interface 121, to set the adjustable parameter. The processing unit 122 receives the setting instruction, and then produces a target model to be simulated that corresponds to the target semiconductor device. The processing unit 122 performs a simulation test with the target model to be simulated, to obtain a simulation result. The simulation test is, for example, an electrical property test or a simulation of the distribution of electrical field intensity in the semiconductor device.

By comparing the simulation result with a standard result, the processing unit 122 can determine whether the simulation result satisfies the standard result. When the simulation result does not satisfy the standard result, the user needs to reset, through the user interface 121, the adjustable parameter until the simulation result satisfies the standard result.

That is to say, after selecting the initial target model, the user does not need to set fabrication parameter values for all the parameter items, and only needs to set parameter values for some of the parameter items. Therefore, variables to be input during the simulation are reduced in number, shortening the development time.

Furthermore, an embodiment of the present disclosure provides a method for developing semiconductor device fabrication processes, which can be performed by the system 100 for developing semiconductor device fabrication processes in FIG. 1.

Figure 4:
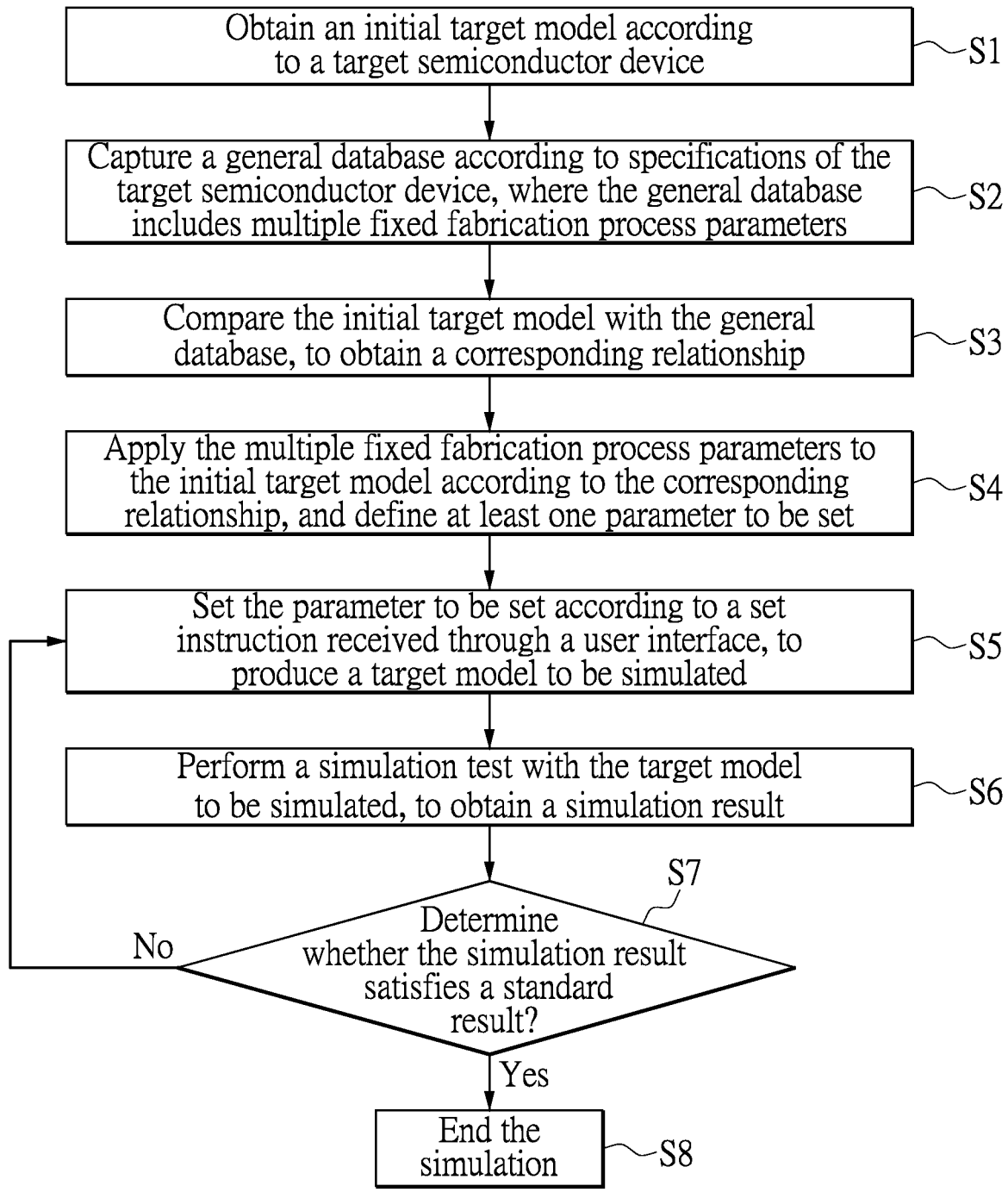
FIG. 4 is a flowchart of a method for developing semiconductor device fabrication processes in accordance with an embodiment of the present disclosure.

With reference to FIG. 1 and FIG. 4, FIG. 4 is a flowchart of a method for developing semiconductor device fabrication processes in an embodiment of the present disclosure. In step S1, an initial target model is obtained according to a target semiconductor device.

Referring to FIG. 1, the processing unit 122 can receive, through the user interface 121, a selection instruction input by a user, and obtain an initial target model from the initial target model database 111. The initial target model includes multiple preset parameter items.

As shown in FIG. 4, in step S2, a general database is captured according to specifications of the target semiconductor device, where the general database includes multiple fixed fabrication parameter values. Furthermore, multiple general databases correspond to different specifications of semiconductor devices.

In an embodiment, an initial target semiconductor model corresponds to specifications of a semiconductor device. Therefore, the processing unit 122 can obtain a corresponding general database 112 according to the specifications corresponding to the initial target semiconductor model. In other embodiments, the processing unit 122 can also receive an instruction input through the user interface 121 by the user, to obtain the corresponding general database 112.

Each general database 112 includes multiple general fabrication process templates each corresponding to multiple general parameter items. Each general parameter item corresponds to a fixed parameter value. The multiple general databases 112 may be pre-established and stored in the memory unit 110.

Figure 5:
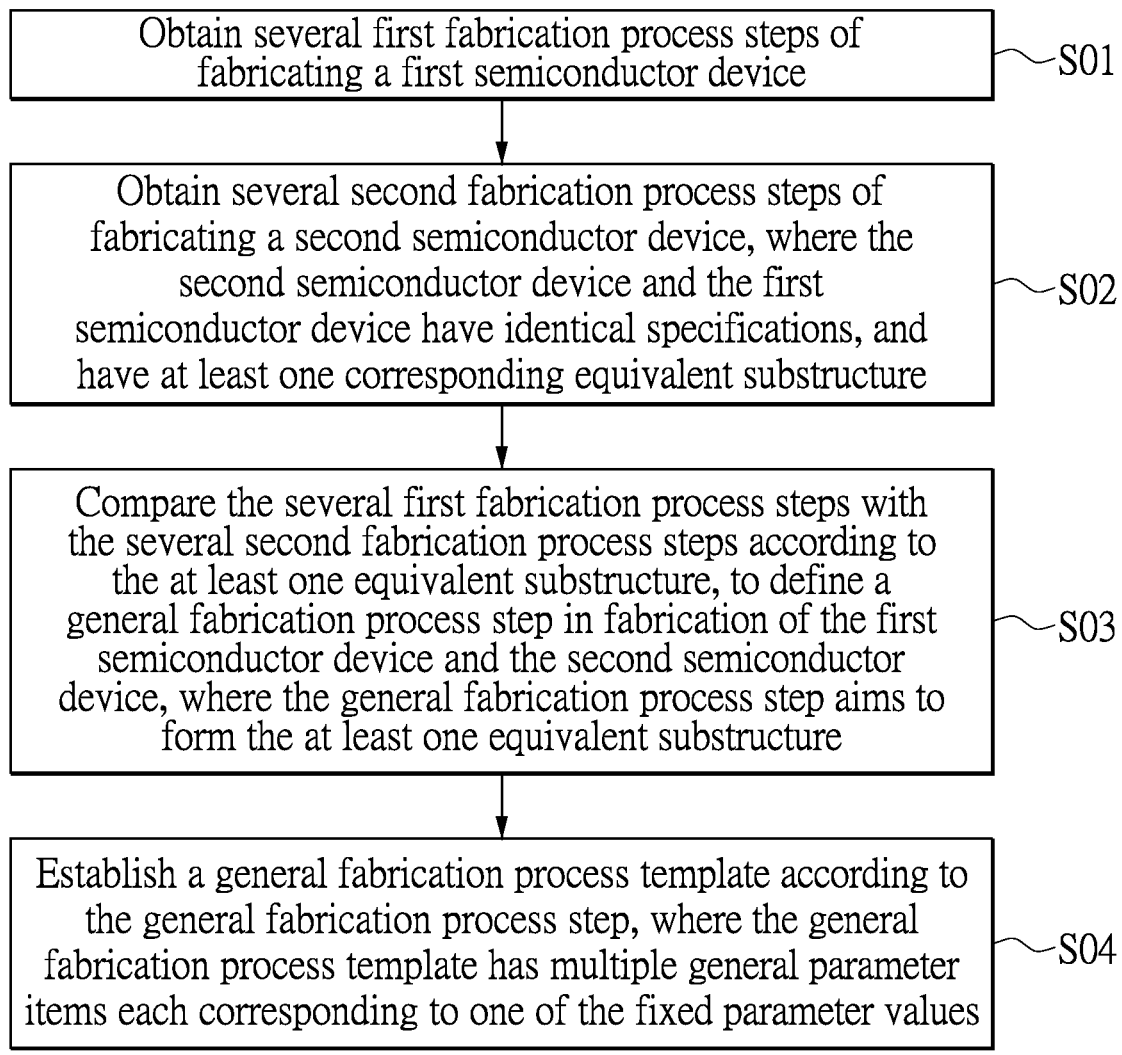
FIG. 5 is a flowchart of a general database being created in accordance with an embodiment of the present disclosure.

First referring to FIG. 5, in this embodiment, a procedure of creating the general database may include the following steps:

In step S01, several first fabrication steps of fabricating a first semiconductor device are obtained. In step S02, several second fabrication steps of fabricating a second semiconductor device are obtained. The second semiconductor device and the first semiconductor device have identical specifications, and have at least one corresponding equivalent substructure.

It should be noted that, since the first semiconductor device has been thoroughly developed in the relevant field, and has specifications that meet industry standards, multiple fabrication parameter values used in several fabrication process steps of the first semiconductor device can be used as reference parameters for development of another semiconductor device (e.g., the second semiconductor device).

In an embodiment, the first semiconductor device is a vertical semiconductor device, and the second semiconductor device is a lateral semiconductor device. Furthermore, the first semiconductor device is a vertical transistor and the second semiconductor device is a lateral transistor. For example, the first semiconductor device is a vertical MOSFET or a vertical bipolar transistor, and the second semiconductor device is a lateral MOSFET or a lateral bipolar transistor.

In an example where the first semiconductor device is a vertical NPN bipolar transistor and the second semiconductor device is a lateral NPN bipolar transistor, as shown in FIG. 2 and FIG. 3, the base region T23 and the emitter region T22 of the lateral bipolar transistor T2 respectively correspond to the base region T13 and the emitter region T12 of the vertical bipolar transistor T1. In addition, the emitter region T21 of the lateral bipolar transistor T2 may correspond to the substrate T11 of the vertical bipolar transistor T1. Therefore, equivalent substructures between the first semiconductor device and the second semiconductor device include: the base region T13 (or the base region T23), the emitter region T12 (or the emitted region T22), and the substrate T11 (or the collector region T21).

It should be noted that, in the foregoing example, the equivalent substructures are corresponding doped regions in the first semiconductor device and the second semiconductor device. However, in other embodiments, an equivalent substructure may also be an electrode pattern layer or a dielectric pattern layer in a line redistribution structure of a semiconductor device.

In step S03, the several first fabrication steps are compared with the several second fabrication steps according to the at least one equivalent substructure, to define a general fabrication step in fabrication of the first semiconductor device and the second semiconductor device, where the general fabrication step can form the at least one equivalent substructure.

As for the first semiconductor device, each of the first fabrication steps includes multiple first parameter items each corresponding to a first parameter value. Referring to the following table 3, using an example in which the first semiconductor device is a vertical NPN bipolar transistor, several first fabrication steps M1 to M4 of fabricating the first semiconductor device can form the substrate T11, the base region T13, the emitter region T12, and the isolation portion T14 respectively.

In addition, the first fabrication steps M1 to M4 correspond to multiple first parameter items M11 to M15, M21 to M25, M31 to M35, and M41 to M42 respectively. Each first parameter item has a corresponding first parameter value.

TABLE 3

| First fabrication steps | First parameter items | First parameter values |
|---|---|---|
| M1: providing a heavily-doped semiconductor substrate (its raw material: N+ substrate epi-wafer) | M11: semiconductor material<br>M12: impurity material<br>M13: resistance value (ohm-cm)<br>M14: ion implantation energy<br>M15: annealing temperature | Silicon (Si)<br>Arsenic (As)<br>0.002<br>60 KeV<br>500° C. to 800° C. |
| M2: forming the base region | M21: impurity material<br>M22: doping density<br>M23: ion implantation energy<br>M24: annealing temperature<br><br>M25: dimensions (including length, width, and height) of the base region | Boron (B)<br>3E13<br>100 KeV<br>1000° C. to 1150° C.<br>125 μm × 125 μm × (3~7)μm |
| M3: forming the emitter region or the collector region | M31: impurity material<br>M32: doping density<br>M33: ion implantation energy<br>M34: annealing temperature<br><br>M35: range (including area and depth) of the emitter region | Arsenic (As)<br>3.5E15<br>60 KeV<br>800° C. to 1000° C.<br>50 μm |
| M4: forming the isolation portion | M41: material of the isolation portion<br>M42: dimensions (including length, width, and depth) of the isolation portion | amorphous silica<br>(10-1000)μm × (1~2)μm × (3~20)μm |

It should be noted that, the first fabrication steps M1 to M4, the first parameter items M11 to M15, M21 to M25, M31 to M35, and M41 to M42, and the multiple first parameter values in table 3 are merely used as examples for description, and the present disclosure is not limited thereto.

For the second semiconductor device (the lateral NPN bipolar transistor), reference is made to table 4. Several second fabrication steps N1 and N2 at least include a step of forming the base region T23 and a step of forming the emitter region T22 and the collector region T21.

TABLE 4

| Second fabrication steps | Second parameter items |
|---|---|
| N1: forming the base region | N11: impurity material<br>N12: doping density<br>N13: ion implantation energy<br>N14: annealing temperature<br>N15: dimensions (including length, width, and height) of the base region |
| N2: forming the mutually spaced emitter region and collector region | N21: impurity material<br>N22: doping density<br>N23: ion implantation energy<br>N24: annealing temperature<br>N25: range (including area and depth) of the emitter region<br>N26: range (including area and depth) of the collector region<br>N27: distance between the emitter region and the collector region |

According to the several equivalent substructures between the first semiconductor device and the second semiconductor device, the several first fabrication steps M1 to M4 are compared with the several second fabrication steps N1 and N2. It can be learned that, the first fabrication step M2 of forming the base region T13 of the first semiconductor device corresponds to the second fabrication step N1 of forming the base region T23 of the second semiconductor device, and the first fabrication step M3 of forming the emitter region T12 of the first semiconductor device corresponds to the second fabrication step N2 of forming the emitter region T22 of the second semiconductor device.

Accordingly, the first fabrication steps M2 and M3 (or the second fabrication steps N1 and N2) may be defined as two general fabrication steps that can be shared in fabrication of the first semiconductor device and the second semiconductor device.

Afterwards, in step S04, a general fabrication process template is established according to the general fabrication step, where the general fabrication process template has multiple general parameter items each corresponding to one of the fixed fabrication parameter values.

With reference to the foregoing description, two general fabrication process templates (reference may be made to the general fabrication process templates G1 and G2 in table 2) can be established according to the first fabrication steps M2 and M3.

In an embodiment, the step of establishing the general fabrication process template may include: comparing each of the first parameter items with the multiple second parameter items according to the position of the equivalent substructure in the first semiconductor device and the position thereof in the second semiconductor device, to obtain an item corresponding relationship; and then determining the multiple general parameter items according to the item corresponding relationship, where the multiple first parameter values corresponding to these general parameter items are defined as the multiple fixed fabrication parameter values.

Referring to tables 3 and 4, the multiple first parameter items M21 to M25 in the first fabrication step M2 may correspond to the multiple second parameter items Ni1 to N15 in the second fabrication step N1, respectively. Accordingly, the first parameter items M21 to M25 in the first fabrication step M2 may be defined as general parameter items corresponding to one of the general fabrication steps.

However, the position of the emitter region T12 in the first semiconductor device (namely, the vertical NPN bipolar transistor) is not necessarily the same as the position of the emitter region T22 in the second semiconductor device (namely, the lateral NPN bipolar transistor). Therefore, not all of the multiple first parameter items M31 to M35 in the first fabrication step M3 are necessarily corresponding to the multiple second parameter items in the second fabrication step N2 of forming the emitter region T22 of the second semiconductor device.

Accordingly, each of the first parameter items M31 to M35 in the first fabrication step M3 is compared with the multiple second parameter items N21 to N27 in the second fabrication step N2, to obtain an item corresponding relationship. According to the item corresponding relationship, it can be determined that the general parameter items include the first parameter items M31 to M35 (or the second parameter items N21 to N25). In addition, the first parameter value corresponding to each of the first parameter items M31 to M35 is defined as a fixed parameter value.

One of the general databases in the embodiment of the present disclosure can be established in the foregoing manner. Therefore, when the system 100 for developing semiconductor device fabrication processes in the embodiment of the present disclosure is used to develop a target semiconductor device, the target semiconductor device may be the first semiconductor device or the second semiconductor device.

Further referring to FIG. 4, in step S3, the initial target model is compared with the general database, to obtain a corresponding relationship. In an embodiment, the comparison of the initial target model with the general database may include the following procedures. First, the multiple general fabrication process templates are compared with the multiple preset fabrication process templates, to determine at least one set of corresponding general fabrication process template and preset fabrication process template.

Then, in this set of corresponding templates, multiple parameter items and multiple general parameter items are compared to determine at least one set of corresponding parameter item and general parameter item.

That is to say, according to the corresponding relationship obtained after the foregoing comparison procedure, the processing unit 122 can determine at least one preset fabrication process template corresponding to one of the general fabrication process templates, and at least one parameter item corresponding to one of the general parameter items.

Afterwards, as shown in FIG. 4, in step S4, the multiple fixed fabrication parameter values are applied to the initial target model according to the corresponding relationship, and at least one adjustable parameter is defined.

Furthermore, in the preset fabrication process template corresponding to the general fabrication process template, the processing unit 122 can use a fixed parameter value of a corresponding general parameter item as a fabrication parameter value of a corresponding parameter item.

Referring to table 5, the description below uses simulation of a fabrication process of a lateral NPN bipolar transistor as an example.

TABLE 5

| Preset fabrication process templates | Parameter items | Fabrication parameter values |
| --- | --- | --- |
| P1: forming the base region | P11: impurity material | Boron (B) |
| | P12: doping density | 3E13 |
| | P13: ion implantation energy | 100 KeV |
| | P14: annealing temperature | 1000° C. to 1150° C. |
| | P15: dimensions (including length, width, and height) of the base region | 400 μm × 200 μm × (3~7)μm |
| P2: forming the mutually spaced emitter region and collector region | P21: impurity material | Arsenic (As) |
| | P22: doping density | 3.5E15 |
| | P23: ion implantation energy | 60 KeV |
| | P24: annealing temperature | 800° C. to 1000° C. |
| | P25: range (including area and depth) of the emitter region | To be set |
| | P26: range (including area and depth) of the collector region | To be set |
| | P27: distance between the emitter region and the collector region | To be set |

After step S3, the processing unit 122 can determine that the preset fabrication process template P1 corresponds to the general fabrication process template G1, and the preset fabrication process template P2 corresponds to the general fabrication process template G2.

In addition, the processing unit 122 can further determine that the multiple parameter items P11 to P15 in the preset fabrication process template P1 respectively correspond to the multiple general parameter items G11 to G15 in the general fabrication process template G1, and that the multiple parameter items P21 to P24 in the preset fabrication process template P2 respectively correspond to the multiple general parameter items G21 to G24 in the general fabrication process template G2.

Accordingly, the processing unit 122 can use the multiple fixed fabrication parameter values corresponding to the general parameter items G11 to G15 and G21 to G24 as the multiple fabrication parameter values of the corresponding multiple parameter items.

It should be noted that, in the preset fabrication process template P2, none of the remaining parameter items P25 to P27 have corresponding general parameter items. Therefore, fabrication parameter values of these parameter items P25 to P27 are defined as parameters to be set.

Further referring to FIG. 4, in step S5, the at least one adjustable parameter is set according to a setting instruction received through a user interface, to produce a target model to be simulated.

As described above, the user then can input a setting instruction through the user interface 121. The processing unit 122 receives the setting instruction, and then according to the setting instruction, sets a fabrication parameter value of at least one parameter item not corresponding to any general parameter item. Referring to table 3 for example, the processing unit 122 may set fabrication parameter values corresponding to the parameter items P25 to P27 according to the setting instruction, to produce the target model to be simulated.

As shown in FIG. 4, in step S6, a simulation test is performed with the target model to be simulated, to obtain a simulation result. Afterwards, in step S7, it is determined whether the simulation result satisfies a standard result.

Because different semiconductor devices require different simulation tests and requirements, the processing unit 122 executes a simulation test required by the target semiconductor device, to obtain a simulation result corresponding to the target semiconductor device.

When the simulation result does not satisfy the standard result, steps S5 to S7 are repeated. That is to say, the user needs to re-input a setting instruction through the user interface 121, to re-adjust the multiple fabrication parameter values corresponding to the parameter items P25 to P27. Thus, a new target model to be simulated is produced, so as to conduct a simulation test again.

In addition, when the simulation result satisfies the standard result, step S8 is performed: ending the simulation.

To sum up, the present disclosure has the following beneficial effects. In the method and system for developing semiconductor device fabrication processes provided by the present disclosure, multiple fixed fabrication parameter values in a general database are applied to an initial target model corresponding to a lateral semiconductor device or a vertical semiconductor device, thus reducing the number of parameters to be set. When the number of the parameters to be set is reduced, the number of variables to be manually input is reduced, thus further shortening the development time.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method for developing semiconductor device fabrication processes, comprising:
    establishing a general database which includes the following steps:
        obtaining a plurality of first fabrication steps of fabricating a vertical semiconductor device, wherein the first fabrication steps includes multiple first parameter items; and
        obtaining a plurality of second fabrication steps of fabricating a lateral semiconductor device, wherein the lateral semiconductor device and the vertical semiconductor device have identical specifications, and the second fabrication steps includes multiple second parameter items;
        defining at least one equivalent substructure according to corresponding substructure between the vertical semiconductor device and the lateral semiconductor device, and determining a general fabrication step and multiple general parameter items thereof according to the at least one equivalent substructure by comparing the multiple first fabrication items to the multiple second fabrication items, wherein the multiple general parameter items include, at least, impurity material, doping density, ion implantation energy, and annealing temperature;
        establishing a general fabrication process template according to the general fabrication step, wherein the general fabrication process template corresponds to conditions of fabricating the at least one equivalent substructure, and includes the multiple general parameter items; and
    S1: obtaining an initial target model according to a target semiconductor device;
    S2: capturing the general database according to specifications of the target semiconductor device;
    S3: comparing the initial target model with the general database, to obtain a corresponding relationship;
    S4: applying the multiple fixed fabrication parameter values to the initial target model according to the corresponding relationship, and defining at least one adjustable parameter, wherein the multiple first parameter values for fabricating the vertical semiconductor device that correspond to the multiple general parameter items are defined as the multiple fixed fabrication parameter values;
    S5: setting the at least one adjustable parameter according to a setting instruction received through a user interface, to produce a target model to be simulated; and
    S6: performing a simulation test with the target model to be simulated to obtain a simulation result.

2. The method according to claim 1, wherein the initial target model includes multiple preset parameter items, the step of comparing the initial target model with the general database includes: comparing the multiple parameter items with the multiple general parameter items, to determine at least one set of corresponding parameter item and general parameter item.

3. The method according to claim 1, wherein the step of establishing the general database further comprising:
    comparing the plurality of first fabrication steps with the plurality of second fabrication steps according to the at least one equivalent substructure, to define the general fabrication step in fabrication of the vertical semiconductor device and the lateral semiconductor device, wherein the general fabrication step is to form the at least one equivalent substructure.

4. The method according to claim 1, wherein the step of establishing the general fabrication process template further includes:
    comparing each of the first parameter items with the multiple second parameter items according to the position of the at least one equivalent substructure in the vertical semiconductor device and the position thereof in the lateral semiconductor device, to obtain an item corresponding relationship; and
    determining the multiple general parameter items according to the item corresponding relationship, wherein the multiple first parameter values corresponding to these general parameter items are defined as the fixed fabrication parameter values.

5. The method according to claim 1, wherein the target semiconductor device is the vertical semiconductor device or the lateral semiconductor device.

6. The method according to claim 1, wherein the vertical semiconductor device has a first collector region and a first emitter region in a vertical direction, and the lateral semiconductor device has a second collector region and a second emitter region in a lateral direction.

7. The method according to claim 6, wherein the vertical semiconductor device is a vertical transistor, and the lateral semiconductor device is a lateral transistor.

8. The method according to claim 6, wherein the vertical semiconductor device is a vertical MOSFET or a vertical bipolar transistor, and the lateral semiconductor device is a lateral MOSFET or a lateral bipolar transistor.

9. The method according to claim 1, further comprising:
    S7: determining whether the simulation result satisfies a standard result;
    wherein when the simulation result does not satisfy the standard result, repeating steps S5 to S7;
    wherein when the simulation result satisfies the standard result, ending the simulation.

10. The method according to claim 1, wherein multiple ones of the general database are stored in a memory unit, and the multiple ones of the general database correspond to multiple specifications of the semiconductor devices, respectively.

* * * * *